United States Patent [19]
Drinkard, Jr. et al.

[11] Patent Number: 5,779,877
[45] Date of Patent: Jul. 14, 1998

[54] RECYCLING OF CIS PHOTOVOLTAIC WASTE

[75] Inventors: William F. Drinkard, Jr.; Mark O. Long; Robert E. Goozner, all of Charlotte, N.C.

[73] Assignee: Drinkard Metalox, Inc., Charlotte, N.C.

[21] Appl. No.: 854,851

[22] Filed: May 12, 1997

[51] Int. Cl.$^6$ ............................... C25C 1/00; C25C 1/24; C25C 1/12; C21B 15/00

[52] U.S. Cl. .................. 205/560; 205/557; 205/575; 205/580; 75/743

[58] Field of Search ........................ 205/560, 557, 205/575, 580; 75/743

[56] References Cited

U.S. PATENT DOCUMENTS 3,506,550  4/1970  Knapp, Jr. ............................ 205/560
5,211,818  5/1993  Moure, Jr. et al. ..................... 75/743

Primary Examiner—Kathryn L. Gorgos
Assistant Examiner—Edna Wong
Attorney, Agent, or Firm—Dougherty & Dremann

[57] ABSTRACT

A method for extracting and reclaiming metals from scrap CIS photovoltaic cells and associated photovoltaic manufacturing waste by leaching the waste with dilute nitric acid, skimming any plastic material from the top of the leaching solution, separating glass substrate from the leachate, electrolyzing the leachate to plate a copper and selenium metal mixture onto a first cathode, replacing the cathode with a second cathode, re-electrolyzing the leachate to plate cadmium onto the second cathode, separating the copper from selenium, and evaporating the depleted leachate to yield a zinc and indium containing solid.

23 Claims, 2 Drawing Sheets

RECYCLING OF CIS PHOTOVOLTAIC WASTE

FIELD OF THE INVENTION

This invention relates to a process for removing metals from photovoltaic waste, and more particularly, to a hydrometallurgical process for removing metals from copper-indium-diselenide (CIS) photovoltaic waste enabling the waste to pass toxic characteristic leaching procedure (TCLP) and to selectively recover the solubilized metals for reuse.

BACKGROUND OF THE INVENTION

Thin film photovoltaic (PV) modules promise to be one of the leading edge power generation technologies of the twenty-first century. More and more attention is being drawn to the potential benefits of using thin film photovoltaic technology and, consequently, production of photovoltaic modules has risen in response to increased demand. However, a number of the metals needed to manufacture thin film photovoltaic modules are generally considered to be hazardous and can cause environmental, health and safety hazards. An ever growing amount of manufacturing waste and disposal of photovoltaic modules accompanies the increased demand for photovoltaic technology and photovoltaic module production. The landfilling of superannuated photovoltaic modules and manufacturing waste associated with photovoltaic cells can release hazardous materials into the environment.

Some of the major elements or compounds used in photovoltaic cells are cadmium, selenium and indium. Cadmium is the principal material used in the process of making photovoltaic cells, particularly CdTe modules, and is a secondary component in CIS photovoltaic modules. The principal effects of continued exposure to low levels of cadmium are significantly apparent on the kidneys, lungs and bones. Cadmium may be fatal if inhaled and is also harmful if swallowed or absorbed through the skin. Prolonged exposure to cadmium can cause stomach pains, vomiting, diarrhea, lung irritation, chest pain and edema. The U.S. Environmental Protection Agency has concluded that the inhaled inorganic cadmium compounds are probable human carcinogens.

Selenium, as an essential trace element, can be used in pure elemental form, or in the form of a hydride gas in the production of CIS modules. It is well known that both forms are highly toxic, and dust carrying selenium can irritate tissues of the skin, eyes, nose and throat. Ingestion of selenium may cause nausea, vomiting, headaches, dizziness, and gastrointestinal irritation. Excess exposure can cause severe irritation of the respiratory tract, which may be followed by pulmonary edema and possible death. Prolonged exposure to selenium may cause dermatitis. Recent animal and human epidemiological evidence suggests that selenium has carcinogenic properties.

Indium, in its elemental form, does not have any known health hazards, and is not regulated by the U.S. Environmental Protection Agency. However, other compounds of indium can cause severe lung damage, liver damage and edema.

The most primary regulatory test to evaluate the toxicity of photovoltaic manufacturing waste and superannuated modules is EPA TCLP (Toxicity Characteristic Leaching Procedure, 40 C.F.R. Ch. 1, Pt. 261, App. II). TCLP requires recycling processes to meet exacting standards.

CIS (Cadmium Indium Diselenide) photovoltaic modules generally contain between 5 and 14 g of Cu or Se per square meter of module. We have observed CdTe modules to contain between 7 and 12 g of Cd or Te per square meter of module. Additional sources of Cd and Se come from manufacturing debris associated with the fabrication of the photovoltaic modules. The manufacturing waste typically includes CdS, $CdInSe_2$ and various non-stoichiometric mixtures containing Cd, Se and Zn. The presence of hazardous metals is prevalent in the manufacture of photovoltaic modules.

DESCRIPTION OF THE RELATED ART

Applicants are aware of the following U.S. Patents and publications concerning recovery of metals.

| U.S. Pat. No. | Inventor | Issue Date | Title |
| --- | --- | --- | --- |
| 4,163,046 | Subramanian et al. | 07-31-1979 | RECOVERY OF SELENIUM |
| 4,244,936 | Victor et al. | 01-13-1981 | RECOVERY OF TELLURIUM FROM ACIDIC SULFONATED ION EXCHANGE RESINS BY ACID ELUTION |
| 4,519,913 | Baldwin et al. | 05-28-1995 | PROCESS FOR THE REMOVAL AND RECOVERY OF SELENIUM FROM AQUEOUS SOLUTIONS |
| 4,770,700 | Bertha et al. | 09-13-1988 | HYDROMETALLURGICAL PROCESS FOR THE SEPARATION AND ENRICHMENT OF GOLD, PLATINUM, AND PALLADIUM, TOGETHER WITH RECOVERY OF SELENIUM FROM THE ANODE SLUDGE OF COPPER ELECTROLYSIS |
| 5,405,588 | Kronberg | 04-11-1995 | PROCESS FOR REMOVING CADMIUM FROM SCRAP METAL |
| 5,407,463 | van Erkel | 04-18-1995 | RECOVERY OF CD AND NI |

| 5,431,713 | Myerson et al. | 07-11-1995 | FROM BATTERIES METHOD FOR THE RECLAMATION OF METALLIC COMPOUNDS FROM ZINC AND LEAD CONTAINING DUST |
| 5,453,111 | Myerson et al. | 09-26-1995 | METHOD FOR SEPARATION OF METALS FROM WASTE STREAM |

PUBLICATIONS

| TITLE | Author |
| --- | --- |
| COPPER: THE SCIENCE AND TECHNOLOGY OF THE METAL ITS ALLOYS AND COMPOUNDS | A. Butts |
| METAL RECYCLING FROM INDUSTRIAL SOLID WASTES | L. W. Lherbier & J. F. Pusateri |
| RECYCLING OF CADMIUM AND SELENIUM FROM PHOTOVOLTAIC MODULES AND MANUFACTURE WASTE: A WORKSHOP REPORT | P. Moskowitz & K. Zweibel |
| RECYCLING NICKEL-CADMIUM BATTERIES THROUGH THE HIGH TEMPERATURE METAL RECOVERY PROCESS | R. H. Hanewald et al. |
| RECOVERING CADMIUM AND TELLURIUM FROM THIN FILM PHOTOVOLTAIC DEVICE SCRAP | W. Tolley and G. Palmer |

Myerson et al., U.S. Pat. No. 5,453,111, teaches a method for the recovery of metals including zinc, zinc oxide, iron-carbon feedstocks, lead and cadmium from industrial waste streams which entails treating the waste streams with carbon and an ammonium chloride solution, separating any undissolved components from the solution, displacing metal ions including lead and cadmium from the solution using zinc metal, treating the solution to remove zinc compounds therefrom, followed by treating the zinc compounds and the undissolved components with a dissolving solution, and further treating the displaced metal ions to recover lead, cadmium and zinc therein using various methods including electrolysis.

Myerson et al., U.S. Pat. No. 5,431,713, teaches a method for the reclamation of zinc, lead, tin, cadmium, and copper from dust containing such elements or compounds which involves leaching the dust with sulfuric acid or ammonium bisulfite, neutralization of the leachate with zinc oxide or zinc hydroxide, and cementing and/or roasting various intermediate and final products for the reclamation of the above metals. The method is especially designed for reclaiming the above metals from waste streams of electrical conductor production processes. The method is a continuous method that recirculates the solutions remaining after the completion of each step.

Baldwin et al., U.S. Pat. No. 4,519,913, teaches a process for reducing the concentration of water soluble ionic selenium species in aqueous waste solutions containing the same. The process comprises passing the waste solution through a treatment zone containing a porous matrix on which are retained populations of at least one bacteria of the genus Clostridium. The passing of the aqueous solution through the treatment zone is carried out at predetermined rates of flow, and contact between the solution and the bacteria is conducted under anaerobic conditions at predetermined pH and temperature levels. The process provides for the conversion of the water soluble ionic selenium species to water insoluble selenium metal, which metal is retained on the porous matrix and can be recovered therefrom.

Van Erkel, U.S. Pat. No. 5,407,463, teaches a method for recovering cadmium, nickel and iron from batteries comprising the steps of: (a) reducing the size of the batteries to small pieces and separating the pieces into a coarse fraction and a fine fraction with the coarse fraction further separated into a magnetic and non-magnetic fraction; (b) leaching out the fine fraction at approximately 90° C.; (c) removing the Cd; (d) stripping the extractant and separating the cadmium therefrom; (e) converting the iron ions into solid iron(III) hydroxide then filtering; and (f) recovering Ni from the filtrate.

Kronberg, U.S. Pat. No. 5,405,588, teaches a process for recovering cadmium from scrap metal comprising the steps of mixing the cadmium containing scrap with an ammonium carbonate solution containing an amine and oxidizing agent, forming a cadmium-amine complex. The solution is evaporated to form a cadmium carbonate mixture, and the cadmium is separated out by means of hydrogen sulfide. This process yields a sulfide product requiring further processing to remove the sulfur.

Victor et al., U.S. Pat. No. 4,244,936, teaches a process for the recovery of tellurium compounds which have been retained on a strongly acidic sulfonated ion exchange resin. The resin is employed to remove soluble tellurium compounds from tellurium-containing vicinal glycol ester solutions, by elution of the resin with dilute mineral acids, such as hydrochloric, to form a tellurium-containing acid eluate and treating the eluate by stripping or distilling to remove contained water and acid. This leaves a tellurium compound concentrate which may be treated in the presence of air or oxygen to convert the tellurium to a form suitable for reuse in the preparation of vicinal glycol esters. This method for tellurium recovery entails the use of expensive ion exchange resins.

Bertha et al., U.S. Pat. No. 4,770,700, teaches a hydrometallurgical process for enrichment of gold, platinum and palladium from copper electrolysis anode sludge, and simultaneous recovery of selenium, in which the sludge is treated with $Cl_2$/HCl to transform the selenium of a hexavalent state and precipitate out silver chloride. The filtrate is then subjected to selective reduction of precipitate. The noble metals and resulting filtrate is chlorinated and a further reduction is effected to precipitate the metallic selenium.

Subramanian et al., U.S. Pat. No. 4,163,046, teaches a hydrometallurgical process for treating copper refinery anode slimes containing selenium, lead and precious metals. A selenium product of better than 99.7% purity can be produced, and the final residue is suitable for smelting to produce anodes for silver refining.

The patents mentioned above are not directed to the recovery of metals from photovoltaic waste.

Proposed methods for the recovery of cadmium and selenium from photovoltaics (P. Moskowitz & K. Zweibel, Recycling of Cadmium and Selenium From Photovoltaic Modules and Manufacture Waste: A Workshop Report, Mar. 11–12, 1992 BNL 47787) treat the photovoltaics similarly to the recycling of waste Ni-Cd batteries. Ni-Cd battery recycling schemes are either pyrometallurgical or hydrometallurgical in nature.

A pyrometallurgical method has been developed by INMETCO (R. H. Hanewald et al., "Recycling Nickel-Cadmium Batteries Through The High Temperature Metal Recovery Process", Proc. 6th International Seminar on Battery Waste Management, Oct. 31–Nov. 2, 1994). The INMETCO process has a high energy requirement typical for furnaces. The cadmium from the INMETCO process is recovered in a wet cake mixed with zinc and lead which must be sent to another processor for further refining.

A hydrometallurgical method to recycle Ni-Cd batteries has been presented by Leto Recycling (R. H. Hanewald et al., "Recycling Nickel-Cadmium Batteries Through The High Temperature Metal Recovery Process", Proc. 6th International Seminar on Battery Waste Management, Oct. 31–Nov. 2, 1994). The Leto process is a 16-step process based upon a HCl leach followed by solvent extraction. The chloride leachates involved are highly corrosive to process equipment. The solvent extraction is also a costly process. The authors state that the process is uneconomical as a cost (or fee) of $0.60–0.80 per Kg of batteries is necessary.

Another strategy for recycling photovoltaic waste is to incorporate such waste into a process for treatment of electric arc furnace (EAF) dust, a material which also has a high percentage of Cd. One processing technology for EAF dust is the flame reactor developed by Horsehead (EPA/540/R-94/526, "Superfund Innovative Technology Evaluation Program", p. 84 (1994); EPA/540/5-91/008, The Superfund Innovative Technology Evaluation Program, 4th Ed., November (1991); EPA/540/R-92/076, The Superfund Innovative Technology Evaluation Program, 5th Report to Congress, October 1992; L. W. Lherbier & J. F. Pusateri, "Metals Recycling From Industrial Solid Wastes," Emerging Technologies in Hazardous Waste Management, Sep. 27–29 (1993), I&EC of the ACS, p. 855). This technology exposes waste solids to temperatures greater than 2,000° C. The results of this process are nonleachable slag combined with metal oxides and a metal alloy. The process has a high energy consumption requirement and produces end products with little or no commercial value which must be sent to a landfill. This technology does not produce a recycle of the Cd, but immobilizes it in the slag sufficiently to pass TCLP. Furnace technology of this type is also capital-intensive, has a high energy requirement, and has not demonstrated the ability to process Te, In and Se.

Significant experimental work performed on photovoltaic scrap recycling has been performed by W. Tolley and G. Palmer (W. Tolley and G. Palmer, Recovering Cadmium and Tellurium From Thin Film Photovoltaic Device Scrap, U.S. Dept. of the Interior, U.S. Bureau of Mines, RI9588, 1995). Their process was based upon leaching the scrap in an acidic ferric chloride solution. In order to achieve efficient extraction of the cadmium and tellurium from the scrap the process required a pressure autoclave at 400 psig at 110° C. under an oxygen atmosphere. These extreme conditions make this process unattractive to scale up to in-situ recycling of PV waste. The pressure autoclave is capital intensive and can pose safety concerns. The introduction of iron as ferric chloride dilutes and contaminates the photovoltaic metals preventing recovery in sufficient purity to allow direct reuse or high value sale.

The removal of selenium and tellurium from electrolytic copper refinery anode slimes are described by Butts (A. Butts, Copper: The Science and Technology of the Metal Its Alloys and Compounds, Reinhold, N.Y., 1954, p. 270). The three methods of winning selenium are: (1) smelting with soda and niter; (2) roasting with soda; and (3) roasting with sulfuric acid. Tellurium is removed from the slimes as water-soluble tellurite. The tellurite is made following an initial oxidizing or sulfating treatment by one of three ways: (1) roasting or baking a slimes-soda mix; (2) refining with soda in a dore or cupellating furnace; and (3) boiling the slimes with caustic soda after an oxidizing or sulfating roast. These methods yield incomplete separation of selenium and tellurium. Application of this method involving roasting to photovoltaic modules is not a viable option when volatile cadmium components are present.

As applied to the recycle of PV semiconductor materials, all of the above approaches are economically and environmentally inefficient by diluting the valuable PV materials and contaminating them so that recovery in reusable form is both difficult and expensive. It is therefore apparent that what is needed is a method to process thin film photovoltaic waste that removes hazardous metals from scrap thin film photovoltaic cells and photovoltaic manufacturing waste. Further needed is a method to process thin film photovoltaic waste that provides for cost-efficient removal of copper, indium and selenium. Further needed is a method to process thin film photovoltaic waste that recycles photovoltaic metals from PV related products and manufacturing waste and produces salable and directly reusable metals. Further needed is a method to process thin film photovoltaic waste that enables the waste to pass TCLP.

SUMMARY OF THE INVENTION

The present invention is a method to process thin film photovoltaic waste that removes hazardous metals from scrap thin film photovoltaic cells and photovoltaic manufacturing waste. Virtually complete removal of the photoactive metals is attained. The cells and waste are leached by an acidic leaching solution to remove the metals. A glass substrate is removed and can be reused in the manufacture of PV cells, recycled or disposed in a non-hazardous waste landfill. A laminating plastic is skimmed from the leaching solution. The present invention separates selenium and copper from a CIS leachate stream by electrolyzing the leaching solution. The present invention also separates out cadmium for recovery as pure metal or for reuse in PV cell manufacture by re-electrolyzing the leaching solution. Any NOx generated during the process steps is captured and recycled as nitric acid for reuse in the process. Selenium and copper are further separated by oxidation and distillation.

OBJECTS OF THE INVENTION

It is the principal object of the present invention to provide a method to process thin film photovoltaic waste by converting the toxic waste to useable product streams.

Another object of the present invention is to provide a method to process thin film photovoltaic waste that removes hazardous metals from scrap thin film photovoltaic cells and photovoltaic manufacturing waste.

Another object of the present invention is to provide a method to process thin film photovoltaic waste that removes and recovers copper, indium and selenium from waste originating from CIS photovoltaic cells and their manufacture in a cost-efficient manner.

Another object of the present invention is to provide a method to process thin film photovoltaic waste that electrolytically separates a copper-selenium stream from a CIS leachate.

Another object of the present invention is to provide a method to process thin film photovoltaic waste that removes photoactive metals from defective cells and recycles the metals and conducting glass plates for reuse in photovoltaic cell manufacture.

Another object of the present invention is to provide a method to process thin film photovoltaic waste that removes hazardous metals from glass plates in scrap photovoltaic cells in order that the glass can be recycled or sent to a landfill.

Another object of the present invention is to provide a method to process thin film photovoltaic waste that enables the waste to pass TCLP.

BRIEF DESCRIPTION OF THE DRAWINGS

The foregoing and other objects will become more readily apparent by referring to the following detailed description and the appended drawings in which.

DETAILED DESCRIPTION

Figure 1:
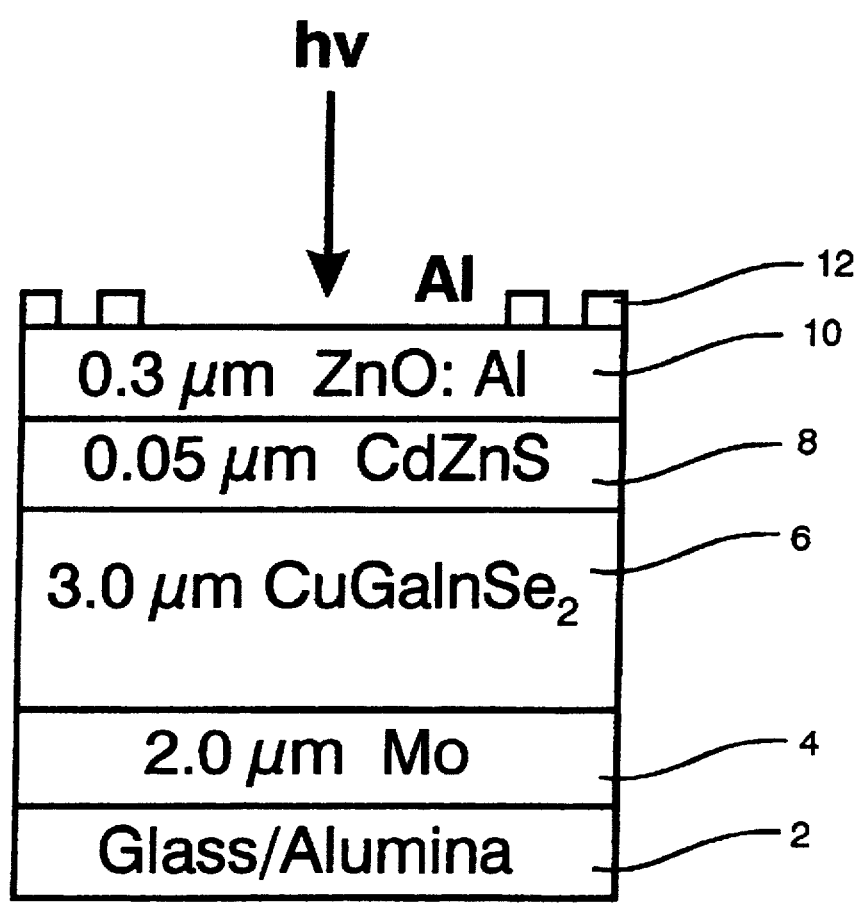
FIG. 1 is a schematic cross-section of a CIS photovoltaic plate showing the current state of the art.

FIG. 1 is a schematic cross-section of a CIS photovoltaic plate. The CIS photovoltaic plate consists of an approximately 2 mm thick substrate of glass or alumina 2 on which is consecutively deposed an approximately 2 µm layer of Mo 4, an approximately 3 µm layer of $CuGaInSe_2$ 6, an approximately 0.05 µm layer of CdZnS 8, and an approximately 0.3 µm layer of ZnO and Al 10. An aluminum electrode structure 12 is applied to the top of the ZnO and Al layer. The direction of the incident light, hv, is denoted by the arrow.

The CIS photovoltaic plate, as is shown in FIG. 1, is assembled into a finished cell. This usually entails laminating the photovoltaic plate onto another glass plate, usually with an interstitial layer of EVA plastic. The required electrical connectors are attached, by soldering or other means, to the edge of the laminate. The complete photovoltaic cell is then assembled by putting the completed laminate in a protective housing.

As shown in FIG. 1, some metals present in thin film photovoltaic cells have toxic characteristics and are environmentally hazardous. These metals, which include Cd and Se, must be removed so that manufacturing rejects and consumed PV cells can pass EPA TCLP and be disposed in an environmentally acceptable fashion.

Figure 2:
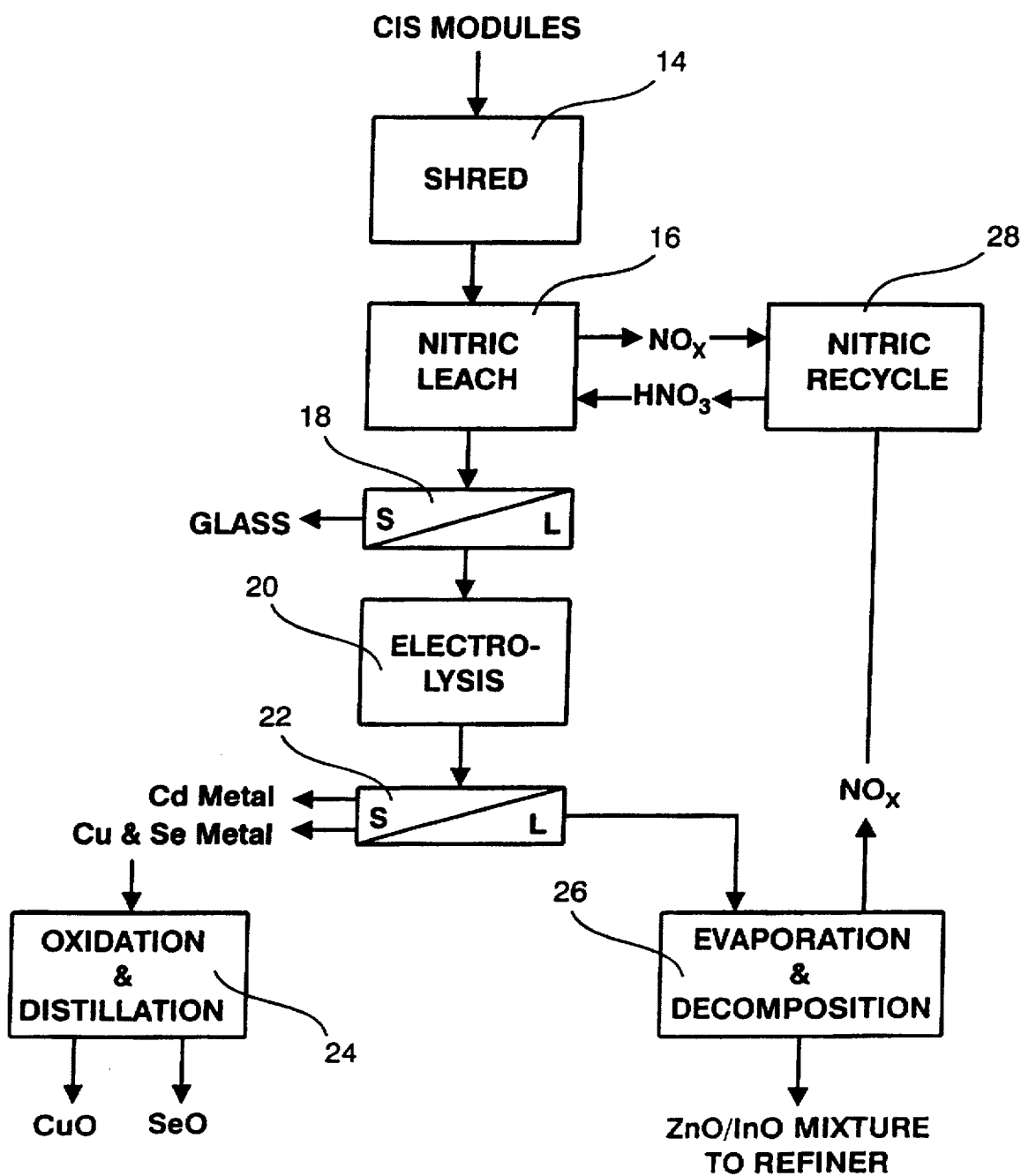
FIG. 2 is a flow diagram process for reclaiming metals from CIS photovoltaic cells and PV manufacturing waste in accordance with the present invention.

FIG. 2 is a flow diagram process for reclaiming metals from CIS photovoltaic cells and PV manufacturing waste in accordance with the present invention. The photovoltaic cells or modules are first shredded 14 to reduce the size to approximately pea-sized pieces. This can be accomplished by a counter-rotating knife shredder, such as one manufactured by O&E Machine Tools or Muffin Monster. Manufacturing waste, such as sandblasting beads or waste solutions, need not be shredded. The function of the shredding is to delaminate the cells and expose the metals to acid attack. Shredding the cells or modules also reduces the size of the glass plate and makes recovery of glass difficult. If the cells are not laminated or if they are delaminated by hand, they can be treated directly with a leaching solution. By not shredding cells, glass can be recovered from the substrate for reuse in the manufacture of PV cells.

The cells and waste are then leached 16 to remove the metals. A leachate is formed by leaching the cells and waste with a leaching solution. The leaching solution, which may also be referred to as a lixivant, consists of an aqueous solution of nitric acid ($HNO_3$) having a nitric acid concentration of from about 5% to about 70% by weight and preferably from about 10% to about 60% by weight. Most preferably, a leaching solution having a nitric acid concentration of from about 50% to about 60% by weight of nitric acid solution is used. When a leaching solution having a nitric acid concentration of from about 50% to about 60% by weight is used, the EVA laminating plastic delaminates and floats to the top of the leaching solution for convenient removal by skimming. Nitric acid is preferably used as the lixivant because it is the only mineral acid which by itself has the ability to both acidify and oxidize. In comparison, sulfuric acid requires the addition of hydrogen peroxide or oxygen under pressure to enable it to be used as an oxidizing lixivant.

During the leach, the deposed metals are oxidized and solubilized into the leach solution. Surprisingly, the $SnO_2$ layer, if one is present, is not removed by the nitric acid leaching solution. If unshredded plates are leached, the photoactive metal layers can be removed, and the glass plate, still retaining the conductive $SnO_2$ layer, can be reused to manufacture PV cells. NOx gas is evolved during the leach, and the NOx can be sent to a recycle 28 to form nitric acid for use in subsequent leaches. CIS photovoltaic cells frequently, but not in all cases, do not utilize $SnO_2$ as a conductive layer. However, a certain proportion of the cells coming into the recycling process will be expected to contain $SnO_2$.

The temperature of the leach step 16 can range from about 20° C. to about a reflux temperature of the leaching solution. The reflux temperature of the leaching solution can be up to about 120° C., depending upon the concentration of the $HNO_3$ and the concentration of the dissolved metals. The preferred leaching temperature is in the range of from about 80° C. to about the reflux temperature of the leaching solution. The most preferred leaching temperature is the reflux temperature of the leaching solution because the temperature is self-regulating at reflux and the metal dissolution kinetics are most favorable at higher temperatures. The leach time is until all the photoactive metals are dissolved and any plastic present delaminates and floats to the top of the leaching solution. The metals are observed to dissolve before about 1 hour has elapsed, but any plastic may take up to about 4 hours to delaminate. The optimal temperature and leach solution concentration to achieve both metal dissolution and plastic delamination and removal is the reflux temperature of the leaching solution and about 50% $HNO_3$ concentration in the leaching solution. Higher concentrations of $HNO_3$ were observed to oxidize and solubilize the plastic, thereby preventing its removal by skimming.

Separation 18 of the leach mixture by decantation or filtration separates the glass from the leachate. The glass is free of environmentally hazardous metals and can be recycled or sent to a landfill. When forming the leachate, a solid substrate of laminating plastic and glass plate (if unshredded) is formed that passes TCLP.

The leach liquor or leachate is then electrolyzed 20 preferably using a pair of Pt electrodes, comprising a cathode and an anode, and a power source attached to the electrodes. A D.C. voltage or electromotive force (emf) of up to about 4 volts and preferably from about 1.0 volt to about 2.5 volts is supplied during electrolysis by power source. The current used can be up to about 4 amperes, and the preferred current used is about 3.4 amperes. The current density used can be up to about 0.0468 amperes/cm$^2$, and the preferred current density used is about 0.0398 amperes/cm$^2$. The current density is defined to be the current provided to the electrodes per unit surface area of the electrodes. Alternative electrode materials include but are not limited to carbon, stainless steel and platinized stainless steel. The electrodes can rotate or be stationary and preferably have a surface area of 85.4 cm$^2$. The electrolysis step 20 is performed at a temperature range from about 20° C. to about 60° C. It was observed that there was a consecutive deposition of metal at the cathode while oxygen was formed at the anode. A mixture of Cu and Se is first deposited, or plated, onto the cathode. After the Cu and Se deposits, Cd then deposits onto the cathode. The Cu and Se is allowed to first depose, then the electrode is replaced with a new electrode and the leachate is re-electrolyzed to deposit or plate cadmium onto the new electrode. The result is the winning of Cd metal and the separation of Cu and Se into a separate stream 22.

The selenium can be separated from the copper by oxidation and distillation 24. One oxidation method is to subject the metal mixture to a sulfating roast wherein:

The selenium dioxide is then removed by distillation at a temperature greater than the sublimation point of selenium dioxide of about 315° C. and less than about 850° C. An oxidative roast can also be performed by using nitric acid to dissolve the mixed copper and selenium metals, wherein:

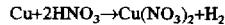

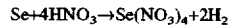

The selenium nitrate is then converted to selenium dioxide and distilled off in a roasting process at a temperature of from about 315° C. to about 850° C.

Following the electrolysis and re-electrolysis 20 of the leach liquor, the remaining aqueous constituents in the depleted leachate are Zn(NO$_3$)$_2$ and In(NO$_3$)$_2$ in solution. Evaporation of the liquor by heating and subsequent decomposition of the evaporation residue 26 at an elevated temperature greater than 100° C. yields a mixture of ZnO and InO. The preferred temperature for this decomposition of nitrate to oxide is from about 400° C. to about 450° C. NOx gas is evolved during the decomposition and is sent to the nitric recycle 28. This metal oxide mixture can be sold to a refiner for further processing and winning of the indium from the zinc. NOx evolved from the evaporation and decomposition can be captured and converted to nitric acid for reuse in the leach stage 16.

By extracting and reclaiming metals found in photovoltaic manufacturing waste and photovoltaic modules, as well as recycling the glass substrate used in the modules and nitric acid used in the leaching solution, the impact on the environment of thin film photovoltaic manufacturing is significantly reduced and overall cost-efficiency is accomplished.

EXAMPLES

Example 1

Extraction of CIS Cells

Scrap CIS photovoltaic plates are pulverized to approximately pea sized pieces and reacted with nitric acid solutions at 110° C. reflux for 4 hours. The ratio of PV scrap to lixivant was 60 g of scrap to 300 g of lixivant. Lixivants containing 10% HNO$_3$, 25% HNO$_3$ and 50% HNO$_3$ were evaluated. The level of metals in the leachate for 3 experimental runs are shown in the table below.

| | EXTRACTION OF CIS CELLS | | | | |
|---|---|---|---|---|---|
| No. | HNO$_3$ Conc. (%) | Cu in Leachate (ppm) | Ga in Leachate (ppm) | In in Leachate (ppm) | Se in Leachate (ppm) |
| 1 | 10 | 1653 | 9.51 | 46.0 | 34.5 |
| 2 | 25 | 1604 | 10.58 | 41.4 | 42.3 |
| 3 | 50 | 2370 | 6.99 | 41.9 | 36.5 |

The results show dissolution of the PV metals in nitric acid. The solid substrate from the leach was observed to pass EPA TCLP testing.

Example 2

Electrolysis of Lixivant Solution

An analog solution of CIS leachate was prepared which contained 1% Cu, 1% In, 2% Se, 1% Zn and 1% Cd in 4M HNO$_3$. The solution was electrolyzed at 3.4 ampere for 2 hours at 60° C. using rotating platinum electrodes.

| | ELECTROLYSIS RESULTS FOR CIS LEACHATE ANALOG | | | | |
|---|---|---|---|---|---|
| Experiment No. | Percentage of Metals Removed | | | | |
| | Cadmium | Copper | Indium | Selenium | Zinc |
| 1 | 0 | 94 | 0 | 90 | 0 |
| 2 | 16 | 99 | 0 | 89 | 0 |
| 3 | 20 | 99 | 0 | 88 | 0 |

The results show that copper and selenium are readily removed from the filtrate by electrolytic methods. Some co-precipitation of cadmium was also observed. Since the electrowinning of cadmium is a known hydrometallurgical method, the results demonstrate that cadmium can also be separated using electrolysis.

Example 3

Separation of Copper and Selenium

An analog mixture of copper and selenium nitrates was prepared by dissolving equal weights of the pure metals in concentrated nitric acid. The solution was evaporated to dryness leaving a residue of mixed copper and selenium nitrate. Samples of this residue were placed in a ceramic boat and roasted in a tube furnace for from 4 to 8 hours. The residue in the boat were analyzed using ICP for the removal of metals.

FURNACE RESULTS FOR THE SEPARATION OF SELENIUM AND COPPER

| Experiment No. | Temperature (°C.) | Time (Hour) | % Cu Removed | % Se Removed |
|---|---|---|---|---|
| 1 | 25 | — | 0 | 0 |
| 2 | 150 | 4 | 6 | 2 |
| 3 | 150 | 4 | 9 | 4 |
| 4 | 250 | 4 | 25 | 25 |
| 5 | 250 | 4 | 12 | 15 |
| 6 | 500 | 4 | 9 | 65 |
| 7 | 500 | 4 | 8 | 68 |
| 8 | 600 | 6 | 10 | 84 |
| 9 | 600 | 6 | 6 | 88 |
| 10 | 600 | 8 | 13 | 89 |
| 11 | 600 | 8 | 6 | 84 |
| 12 | 700 | 6 | 7 | 98 |
| 13 | 700 | 6 | 10 | 98 |
| 14 | 700 | 8 | 2 | 98 |
| 15 | 700 | 8 | 13 | 93 |

The results show that a temperature of at least 600° C. is required for adequate separation of selenium from copper.

SUMMARY OF ACHIEVEMENTS OF OBJECTS OF THE INVENTION

From the foregoing, it is readily apparent that we have invented a method to process thin film photovoltaic waste by converting the toxic waste to useable product streams. The present invention provides a method to process thin film photovoltaic waste that removes hazardous metals from scrap thin film photovoltaic cells and photovoltaic manufacturing waste. The present invention provides a method to process thin film photovoltaic waste that removes and recovers copper, indium and selenium from waste originating from CIS photovoltaic cells and their manufacture in a cost-efficient manner. The present invention provides a method to process thin film photovoltaic waste that electrolytically separates a copper-selenium stream from a CIS leachate. The present invention provides a method to process thin film photovoltaic waste that removes photoactive metals from defective cells and recycles the metals and conducting glass plates for reuse in photovoltaic cell manufacture. The present invention provides a method to process thin film photovoltaic waste that removes hazardous metals from glass plates in scrap photovoltaic cells in order that the glass can be recycled or sent to a landfill. The present invention provides a method to process thin film photovoltaic waste that enables the waste to pass TCLP.

It is to be understood that the foregoing description and specific embodiments are merely illustrative of the best mode of the invention and the principles thereof, and that various modifications and additions may be made to the apparatus by those skilled in the art, without departing from the spirit and scope of this invention, which is therefore understood to be limited only by the scope of the appended claims.

What is claimed is:

1. A method for recycling metals from scrap cadmium-indium-diselenide (CIS) photovoltaic cells including copper and manufacturing waste, comprising the steps of:
   forming a solid substrate and a leachate by leaching the scrap photovoltaic cells and manufacturing waste with a solution comprising nitric acid and water;
   electrolyzing the leachate to selectively deposit a mixture comprising copper and selenium onto a first cathode; and
   re-electrolyzing the leachate to deposit cadmium metal onto a second cathode while leaving a depleted leachate comprising zinc and indium.

2. A method according to claim 1 further comprising separating selenium from said mixture.

3. A method according to claim 2 wherein separating selenium from the mixture comprises the steps of:
   oxidizing the mixture; and
   distilling off $SeO_2$ from the mixture at a temperature less than about 850° C.

4. A method according to claim 1 further comprising the steps of:
   evaporating the depleted leachate to yield a residue comprising zinc and indium; and
   decomposing the residue to obtain a mixture comprising ZnO and InO.

5. A method according to claim 4 wherein decomposing the residue is carried out at a temperature of from about 400° C. to about 450° C.

6. A method according to claim 1 wherein the solid substrate passes toxic characteristic leaching procedure (TCLP).

7. A method according to claim 1 wherein the solution has a nitric acid concentration of from about 5% to about 70%.

8. A method according to claim 1 wherein the solution has a nitric acid concentration of from about 25% to about 50%.

9. A method according to claim 1 wherein the solution has a reflux temperature, and wherein forming a solid substrate is carried out at a temperature of from about 20° C. to about the reflux temperature of the solution.

10. A method according to claim 1 wherein the solution has a reflux temperature, and wherein forming a solid substrate is carried out at a temperature of from about 80° C. to about the reflux temperature.

11. A method according to claim 1 wherein the solution has a reflux temperature, and wherein forming a solid substrate is carried out at a temperature of about the reflux temperature of the solution, and wherein the solution has a nitric acid concentration of about 50%.

12. A method according to claim 1 wherein forming a solid substrate is performed for a period of time for any plastic in the solid to delaminate and float to the top of the solution.

13. A method according to claim 1 wherein electrolyzing the leachate is performed at a current density of about 0.0468 amperes/$cm^2$.

14. A method according to claim 1 wherein electrolyzing the leachate is performed at a current density of about 0.0398 amperes/$cm^2$.

15. A method according to claim 1 wherein the first cathode and the second cathode comprise a material selected from a group consisting of platinum, carbon, stainless steel and platinized stainless steel.

16. A method for removal and recovery of metals from photovoltaic cells and manufacturing waste, the cells having layers of metal, glass and plastic, the method comprising the steps of:
   delaminating the cells;
   leaching the cells and waste with a solution comprising nitric acid and water to form a leachate;
   separating a substrate comprising glass and plastic from the leachate;
   electrolyzing the leachate to deposit a mixture of copper and selenide onto a first cathode; and re-electrolyzing the leachate to deposit cadmium onto a second cathode.

17. A method according to claim 16 wherein said substrate passes toxic characteristic leaching procedure (TCLP).

18. A method according to claim 16 wherein separating a substrate further comprises the steps of:

removing the plastic from the leachate; and filtering the glass from the leachate.

19. A method according to claim 16 wherein the solution has a nitric acid concentration of from about 5% to about 70%.

20. A method according to claim 16 wherein the solution has a reflux temperature, and wherein leaching the cells and waste is carried out at about the reflux temperature of the solution, and wherein the solution has a nitric acid concentration of about 50%.

21. A method according to claim 16 wherein electrolyzing the leachate and re-electrolyzing the leachate are performed at a current density of about 0.0398 amperes/cm$^2$.

22. A method according to claim 16 wherein leaching the cells and waste is performed for a period of time for any plastic in the cells to delaminate and float to the top of the solution.

23. A method according to claim 16 wherein the solution has a nitric acid concentration of from about 50% to about 60%.

* * * * *

UNITED STATES PATENT AND TRADEMARK OFFICE
CERTIFICATE OF CORRECTION

PATENT NO.   :   5,779,877
DATED        :   July 14, 1998
INVENTOR(S)  :   WILLIAM F. DRINKARD, JR., et al.

It is certified that error appears in the above-indentified patent and that said Letters Patent is hereby corrected as shown below:

In Column 1, before the Field of the Invention, please insert the following:

-- The United States Government has rights in this invention pursuant to contract No. DE-FG02-95ER81951 between the U.S. Department of Energy and Drinkard Metalox, Inc. --

Signed and Sealed this

First Day of December, 1998

BRUCE LEHMAN

*Attest:*

*Attesting Officer*          *Commissioner of Patents and Trademarks*